(12) United States Patent  (10) Patent No.: US 8,927,313 B2
Lee et al.  (45) Date of Patent: Jan. 6, 2015

(54) METHOD FOR MANUFACTURING A SOLAR CELL

(75) Inventors: Kyoungsoo Lee, Seoul (KR); Seongeun Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 148 days.

(21) Appl. No.: 13/469,832

(22) Filed: May 11, 2012

(65) Prior Publication Data
US 2013/0164887 A1  Jun. 27, 2013

(30) Foreign Application Priority Data
Dec. 23, 2011 (KR) .................. 10-2011-0141148

(51) Int. Cl.
H01L 31/18 (2006.01)

(52) U.S. Cl.
USPC .............................. 438/57; 438/98; 438/548

(58) Field of Classification Search
USPC .............................................. 438/57, 89, 98
See application file for complete search history.

(56) References Cited

U.S. PATENT DOCUMENTS

| | | | |
|---|---|---|---|
| 6,429,037 B1 | 8/2002 | Wenham et al. | |
| 7,196,018 B2 * | 3/2007 | Szlufcik et al. | 438/745 |
| 7,670,966 B2 * | 3/2010 | Dubois et al. | 438/796 |
| 7,897,867 B1 * | 3/2011 | Mulligan et al. | 136/256 |
| 7,935,562 B2 * | 5/2011 | Enjalbert et al. | 438/72 |
| 7,943,417 B2 * | 5/2011 | Ribeyron et al. | 438/98 |
| 7,951,637 B2 * | 5/2011 | Weidman et al. | 438/57 |
| 8,071,418 B2 * | 12/2011 | Rohatgi et al. | 438/87 |
| 8,110,431 B2 * | 2/2012 | Rohatgi et al. | 438/98 |
| 8,278,163 B2 * | 10/2012 | Machida et al. | 438/166 |
| 8,309,446 B2 * | 11/2012 | Weidman et al. | 438/558 |
| 8,728,922 B2 * | 5/2014 | Krokoszinski et al. | 438/548 |
| 2002/0146868 A1 * | 10/2002 | Miyasaka | 438/149 |
| 2008/0076203 A1 * | 3/2008 | Ribeyron et al. | 438/72 |
| 2009/0253225 A1 * | 10/2009 | Dubois et al. | 438/58 |
| 2010/0051830 A1 * | 3/2010 | Machida et al. | 250/492.2 |
| 2010/0055822 A1 * | 3/2010 | Weidman et al. | 438/57 |
| 2010/0167457 A1 * | 7/2010 | Kim et al. | 438/72 |
| 2011/0139229 A1 * | 6/2011 | Rohatgi et al. | 136/255 |
| 2011/0139230 A1 * | 6/2011 | Rohatgi et al. | 136/255 |
| 2011/0139231 A1 * | 6/2011 | Meier et al. | 136/255 |
| 2012/0107998 A1 * | 5/2012 | Rohatgi et al. | 438/72 |
| 2012/0125416 A1 * | 5/2012 | Rohatgi et al. | 136/255 |
| 2012/0220070 A1 * | 8/2012 | Chiou et al. | 438/98 |
| 2012/0279563 A1 * | 11/2012 | Meier et al. | 136/256 |
| 2013/0119030 A1 * | 5/2013 | Harten | 219/121.85 |
| 2013/0139884 A1 * | 6/2013 | Lee et al. | 136/258 |
| 2013/0146999 A1 * | 6/2013 | Emeraud | 257/432 |
| 2013/0164883 A1 * | 6/2013 | Moslehi et al. | 438/89 |
| 2013/0164887 A1 * | 6/2013 | Lee et al. | 438/98 |
| 2013/0267059 A1 * | 10/2013 | Kim et al. | 438/87 |
| 2013/0292800 A1 * | 11/2013 | Cao et al. | 257/613 |

FOREIGN PATENT DOCUMENTS

KR  1020110069493 A  6/2011
WO  2011/104197 A1  9/2011

* cited by examiner

Primary Examiner — Earl Taylor
(74) Attorney, Agent, or Firm — McKenna Long & Aldridge LLP

(57) ABSTRACT

In a method for manufacturing a solar cell where the solar cell includes a dopant layer having a first portion of a first resistance and a second portion of a second resistance lower than the first resistance, the method includes ion-implanting a dopant into the semiconductor substrate to form the dopant layer; firstly activating by heating the second portion and activating the dopant at the second portion; and secondly activating by heating the first portion and the second portion and activating the dopant at the first portion and the second portion.

20 Claims, 9 Drawing Sheets

ST10

ST20

METHOD FOR MANUFACTURING A SOLAR CELL

CROSS-REFERENCE TO RELATED APPLICATION

This application claims the priority benefit of Korean Patent Application No. 10-2011-0141148, filed on Dec. 23, 2011 in the Korean Intellectual Property Office, the disclosure of which is incorporated herein by reference.

BACKGROUND

1. Field of the Disclosure

The present disclosure relates to a method for manufacturing a solar cell, and in particular, to a method for manufacturing the solar cell including a dopant layer.

2. Description of the Related Art

Recently, as it is expected that conventional energy resource such as petroleum and coal will be exhausted, interest in alternative energy replacing the conventional energy resources is gradually increasing. Among them, a solar cell is spotlighted as a new generation cell using a semiconductor device for directly converting solar energy into electric energy.

In a solar cell, a p-n junction is formed by forming a dopant layer so that solar energy can be converted into electric energy, and an electrode connected to the dopant layer of an n-type or a p-type is formed to draw the electric energy. In order to improve the dopant layer, a structure where the dopant layer has different dopant concentration is proposed. However, in order to form the dopant layer, a mask is used or doping processes are repeated several times. This results in a process that is complicated and the productivity is low.

SUMMARY

The present disclosure is directed to a method for manufacturing a solar cell having an improved doping layer that may also be able to be manufactured by a simple method.

Also, the present disclosure is directed to a method for manufacturing a solar cell that may be able to enhance an align property between a doping layer and an electrode.

In a method for manufacturing the solar cell according to an embodiment of the present invention, the solar cell comprises a dopant layer having a first portion of a first resistance and a second portion of a second resistance lower than the first resistance. The method includes forming the dopant layer including ion-implanting a dopant into the semiconductor substrate to form the dopant layer; firstly activating by heating the second portion to activate the dopant at the second portion; and secondly activating by heating the first portion and the second portion to activate the dopant at the first portion and the second portion.

DETAILED DESCRIPTION OF THE PREFERRED EMBODIMENTS

Figure 1:
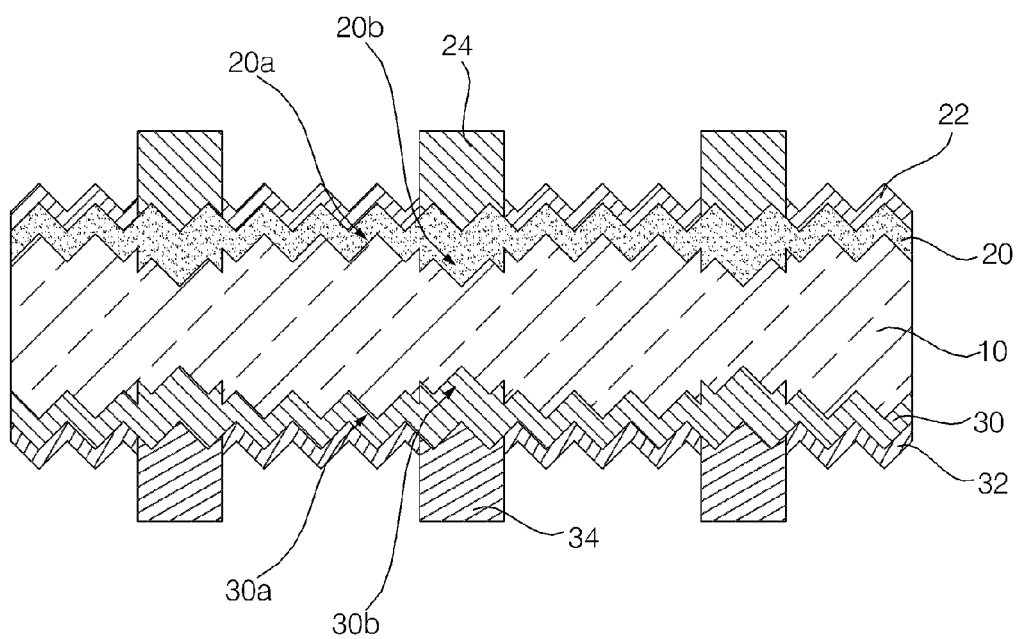
FIG. 1 is a cross-sectional view illustrating a solar cell manufactured by a method for manufacturing a solar cell according to an embodiment of the present invention.

Hereinafter, embodiments of the present invention will be described with reference to the accompanying drawings. However, the present invention is not limited the embodiments, and the various modifications of the embodiments are possible.

In order to clearly and concisely illustrate the embodiments of the present invention, elements that may not aid in the understanding of the embodiments may be omitted in the figures. Also, elements similar to or the same as each other may have the same reference numerals. In addition, the dimensions of layers and regions may be exaggerated or schematically illustrated, or some layers may be omitted for clarity of illustration. In addition, the dimension of each part as drawn may not reflect an actual size.

In the following description, when a layer or substrate "includes" another layer or portion, it can be understood that the layer or substrate further includes still another layer or portion. Also, when a layer or film is referred to as being "on" another layer or substrate, it can be directly on the other layer or substrate, or intervening layers can also be present. Further, when a layer or film is referred to as being "directly on" another layer or substrate, it can be directly on the other layer or substrate, and thus, there is no intervening layer.

Hereinafter, a method for manufacturing a solar cell according to an embodiment of the present invention will be described with reference to the accompanying drawings. A solar cell manufactured by a method for manufacturing a solar cell according to an embodiment will be described, and then, the method for manufacturing the solar cell will be described.

FIG. 1 is a cross-sectional view illustrating a solar cell manufactured by a method for manufacturing a solar cell according to an embodiment of the present invention.

Referring to FIG. 1, a solar cell 100 according to the present embodiment includes a semiconductor substrate 10, an emitter layer 20 formed at or adjacent to a first surface of the semiconductor substrate 10 (hereinafter, referred to as "the front surface"), and a back surface field layer 30 formed at or adjacent to a second surface of the semiconductor substrate 10 (hereinafter, referred to as "the back surface"). Also, the solar cell 100 may include an anti-reflection film 22 and a front electrode (or a plurality of front electrodes) 24 formed at the front surface of the semiconductor substrate 10, and may include a passivation film 32 and a back electrode (or a plurality of back electrodes) 34 formed at the back surface of the semiconductor substrate 10. The detailed structure of the solar cell 100 will now be described.

The semiconductor substrate 10 may include various semiconductor materials. For example, the substrate 10 may include silicon having a first conductivity type dopant. For silicon, single crystal silicon or polycrystalline silicon may be used. For example, the first conductivity type may be an n-type. That is, the semiconductor substrate 10 may include single crystal silicon or polycrystalline silicon having a group V element, such as phosphorus (P), arsenic (As), bismuth (Bi), antimony (Sb), or the like.

When the semiconductor substrate 10 has the n-type dopant as in the above, the emitter layer having a p-type dopant is formed at the front surface of the semiconductor substrate 10, and thereby forming a p-n junction. When the sun light is incident on the p-n junction, the electrons generated by the photoelectric effect moves to the back surface of the semiconductor substrate 10, and the holes generated by the photoelectric effect moves to the front surface of the semiconductor substrate 10. Then, the electric energy is generated.

Here, the holes having mobility smaller than the electrodes move to the front surface of the semiconductor substrate 10, and not to the back surface of the semiconductor substrate 10. Therefore, the conversion efficiency of the solar cell 100 may be enhanced.

The front and back surfaces of the silicon semiconductor substrate 10 may be a textured surface to have protruded or dented portions of various shapes (such as a pyramid shape, for example). Thus, the reflectance of the incident sun light at the front surface of the semiconductor substrate 10 may be reduced by the texturing. Then, the light reaching the p-n junction between the semiconductor substrate 10 and the emitter layer 20 may increase, thereby reducing an optical loss of the solar cell 100.

The emitter layer 20 having a second conductive type dopant may be formed at the front surface of the semiconductor substrate 10. The emitter layer 20 may include a p-type dopant such as a group III element, such as boron (B), aluminum (Al), gallium (Ga), or the like.

In the embodiment, the emitter layer 20 includes a first portion 20a formed adjacent to the anti-reflection film 22 where the front electrodes 24 are not formed, and a second portion 20b being in contact with the front electrode 24. The second portion 20b has a second resistance lower than a first resistance of the first portion 20a.

Here, the first portion 20a has a resistance of about 70~110 ohm/□, and the second portion 20b has a resistance of about 20~40 ohm/□. When the first portion 20a has a resistance of about 70~110 ohm/□, the passivation property may be maximized. Also, when the second portion 20b has a resistance of about 20~40 ohm/□, the resistance with the first electrode 24 may be reduced. However, the present invention is not limited thereto, and thus, the resistance may be varied.

Thus, a shallow emitter may be achieved at the first portion 20a where the first electrodes 24 are not formed and the sun light is incident, thereby enhancing the efficiency of the solar cell 100. In addition, contact resistance between the front electrode 24 and the second portion 20b may be reduced by the second portion 20b. That is, since the emitter layer 20 has an emitter structure with selective portions, the efficiency of the solar cell 100 may be maximized.

The anti-reflection film 22 and the front electrode 24 may be formed on the emitter 20 at the front surface of the semiconductor substrate 10.

The anti-reflection film 22 may substantially cover the entire front surface of the semiconductor substrate 10, except for the portions where the front electrodes 24 are formed. The anti-reflection film 22 reduces reflectance (or reflectivity) of sun light incident to the front surface of the semiconductor substrate 10. Also, the anti-reflection film 22 passivates defects at a surface or a bulk of the emitter layer 20.

Since the reflectance of the sun light is reduced by the anti-reflection film 22, an amount of the sun light reaching the p-n junction formed between the semiconductor substrate 10 and the emitter layer 20 is increased, thereby increasing short circuit current (Isc) of the solar cell 100. Also, because the defects at the emitter layer 20 are passivated, recombination sites of minority carrier are reduced or eliminated, thereby increasing an open-circuit voltage (Voc) of the solar cell 100. Accordingly, the open-circuit voltage (Voc) and the short-circuit current (Isc) of the solar cell 100 are increased by the anti-reflection layer 22, and thus, the efficiency of the solar cell 100 may be enhanced.

The anti-reflection film 22 may include various materials. The anti-reflection film 22 may have a single film structure or a multi-layer film structure including, for example, at least one material selected from a group including silicon nitride, silicon nitride including hydrogen, silicon oxide, silicon oxy nitride, $MgF_2$, ZnS, $TiO_2$ and $CeO_2$. However, the present invention is not limited thereto, and thus, the anti-reflection film 22 may include various materials.

The front electrode 24 may include various metals having high electrical conductivity. For example, the front electrode 24 may include silver (Ag) having high electrical conductivity. However, the present invention is not limited thereto. The front electrode 24 may be a single layer including transparent conductive materials, or may have a stacked structure having a transparent conductive layer and a metal layer (called "a bus bar" or "a finger electrode") on the transparent conductive layer.

The back surface field 30 is formed at the back surface of the semiconductor substrate 10, and has the first conductive type dopant with a doping concentration higher than that of the semiconductor substrate 10. The back surface field 30 may prevent recombination of electron-hole pairs at the back surface of the semiconductor substrate 10, and may enhance the efficiency of the solar cell 100. The back surface field 30 may include a group V element, such as phosphorus (P), arsenic (As), bismuth (Bi), antimony (Sb), or the like.

In the embodiment, a first portion 30a is a passivation portion not being electrically connected to the second electrode 34 and preventing the recombination of the electrons and the holes. The second portion 30b is a portion being connected to the second electrode 34. The first portion 30a has a relatively high resistance, and the second portion 30b has a relatively low resistance.

Here, the first portion 30a has a resistance of about 70~110 ohm/□, and the second portion 30b has a resistance of about 20~40 ohm/□. When the first portion 30a has a resistance of about 70~110 ohm/□, the passivation property may be maximized. Also, when the second portion 30b has a resistance of about 20~40 ohm/□, the resistance with the second electrode 34 may be reduced. However, the present invention is not limited thereto, and thus, the resistance may be varied.

The passivation film 32 and the back electrode 34 may be formed at the back surface of the semiconductor substrate 10.

The passivation film 32 may cover substantially the entire back surface of the semiconductor substrate 10, except for the portions where the back electrodes 34 are formed. The passivation film 32 eliminates a recombination site of minority carriers existing on the back surface of the semiconductor 10. Thus, an open circuit voltage (Voc) of the solar cell 100 may be increased.

The passivation film 32 may include transparent insulating material for passing the light through. Thus, the light may be incident to the back surface of the semiconductor substrate 10 through the passivation film 32, and thereby enhancing the efficiency of the solar cell 100. The passivation film 32 may have a single film structure or a multi-layer film structure including, for example, at least one material selected from a group including silicon nitride, silicon nitride including hydrogen, silicon oxide, silicon oxy nitride, $MgF_2$, ZnS, $TiO_2$ and $CeO_2$. However, the present invention is not limited thereto, and thus, the passivation film 32 may include various materials.

The back electrode 34 may include various metals having high electrical conductivity. For example, the back electrode 34 may include silver (Ag) having high electrical conductivity and high reflectance. When the back electrode 34 includes the silver having high reflectance, the back electrode 34 may reflect the light toward the back surface of the semiconductor substrate 10 and the light toward the inside of the semiconductor substrate 10. Thus, the amount of the used light may be increased.

The back electrode 34 may have a width larger than the front electrode 24. Also, the back electrode 34 may have various shapes as seen in plan view.

In the above, the semiconductor substrate 10 is the n-type, and the emitter layer 20 is the p-type. However, the present invention is not limited thereto. Thus, the semiconductor substrate 10 may be the p-type, and the emitter layer 20 may be the n-type. That is, various modifications are possible.

In the solar cell 100 according to the embodiment, since the dopant layer (that is, the emitter layer 20 or the back surface field layer 30) has a structure with selective portions, the efficiency of the solar cell may be maximized. In the method for manufacturing the solar cell according to the embodiment of the present invention, the method for manufacturing the dopant layer (that is, the emitter layer 20 or the back surface field layer 30) is improved. This will now be described in detail. In the following description, the described portions in the above may be omitted, and the not-described potions in the above may be described in more detail.

Figure 2:
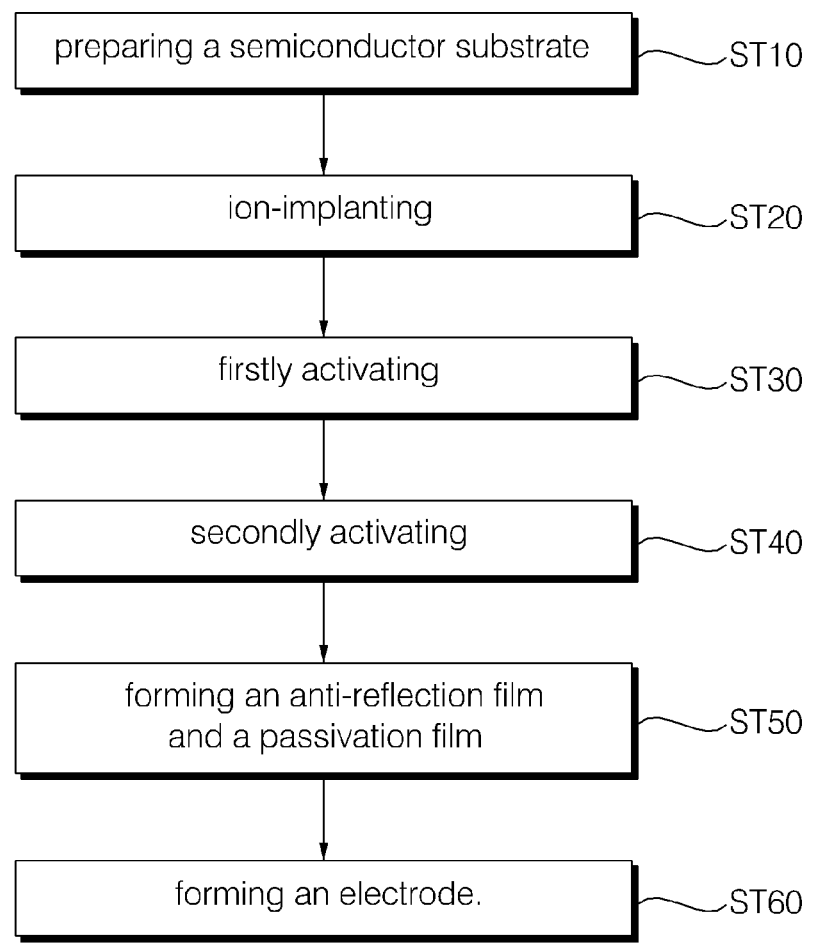
FIG. 2 is a flow chart for illustrating a method for manufacturing a solar cell according to an embodiment of the present invention.

FIG. 2 is a flow chart for illustrating a method for manufacturing a solar cell according to an embodiment of the present invention. FIGS. 3a to 3f are cross-sectional views for illustrating a method for manufacturing a solar cell according to an embodiment of the present invention.

Referring to FIG. 2, a method for manufacturing a solar cell according to the present embodiment includes a step ST10 for preparing a semiconductor substrate, a step ST20 for ion-implanting, a step ST30 for firstly activating, a step ST40 for secondly activating, a step ST50 for forming an anti-reflection film and a passivation film, and a step ST60 for forming an electrode.

Figure 3A:
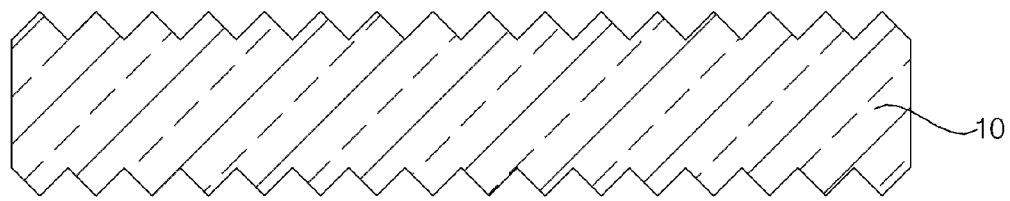
FIGS. 3a to 3f are cross-sectional views for illustrating a method for manufacturing a solar cell according to an embodiment of the present invention.

First, as shown in FIG. 3a, in the step ST10 for preparing the semiconductor substrate, a semiconductor substrate 10 having a first conductive type dopant is prepared. The front and back surfaces of the silicon semiconductor substrate 10 may be textured to have protruded and/or dented portions of various shapes (or to have an uneven surface). For the texturing method, a wet etching method or a dry etching method may be used. In the wet etching method, the substrate 10 may be dipped into a texturing solution. With the wet etching method, the process time may be short. In the dry etching method, the surface of the semiconductor substrate 10 is etched by a diamond drill or a laser. With the dry etching method, the protruded and/or dented portions may be uniformly formed; however, the semiconductor substrate 10 may be damaged and the process time may be long. Regardless, the semiconductor substrate 10 may be textured by various methods.

Figure 3B:
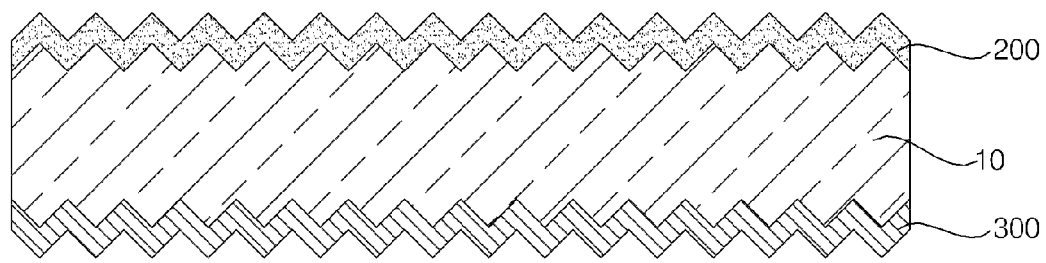

Next, as shown in FIG. 3b, in the step ST20 for ion-implanting, a first layer 200 is formed by doping with the second conductive type dopants at the front surface of the semiconductor substrate 10, and a second layer 300 is formed by doping with the first conductive type dopants at the back surface of the semiconductor substrate 10.

More specifically, the second conductive type dopants are doped with a uniform dose at the front surface of the semiconductor substrate 10, and the first conductive type dopants are doped with a uniform dose at the back surface of the semiconductor substrate 10. The doping of the second conductive type dopants and the doping of the first conductive type dopants may be simultaneously performed or may be sequentially performed.

For example, when boron is used for the dopants, boron may be implanted by using an energy of about 5~20 keV with the dose of about $2~4\times10^{15}/cm^2$. Boron has a small mass, and thus, boron is stopped by electronic stopping not nuclei stopping. Thus, boron may be implanted by using an energy of about 5~20 keV with the dose of about $2~4\times10^{15}/cm^2$ so as not to damage the semiconductor substrate 10. Also, the ranges may be decided considering the resistance of the emitter layer 20 (FIG. 3d) or the back surface field layer 30 (FIG. 3d).

Selectively, when phosphorus is used for the dopants, phosphorus may be implanted by using an energy of about 10~50 keV with the dose of about $3~8\times10^{15}/cm^2$. With the energy and the dose, the semiconductor substrate 10 becomes partially amorphous by the phosphorus. Then, the growth through solid state epitaxy may be induced from the silicon. In this case, silicon acts as a seed during the heat-treatment of the firstly and/or secondly activating. That is, when phosphorus is used at the above energy and the above dose, the lattice of the semiconductor substrate 10 is damaged. Then, the growth through the solid state epitaxy is induced during the activation heat-treatment in the firstly and/or secondly activating ST30 and/or ST40, and thus, the temperature of firstly and secondly activating ST30 and ST40 by using the solid state epitaxy may be reduced. Also, the ranges may be decided considering the resistance of the emitter layer 20 (FIG. 3d) or the back surface field layer 30 (FIG. 3d).

When the first and second conductive type dopants are doped by the ion-implanting method as in the above, a doping in a lateral direction may be reduced. Accordingly, the doping concentration may be easily controlled.

Figure 3C:
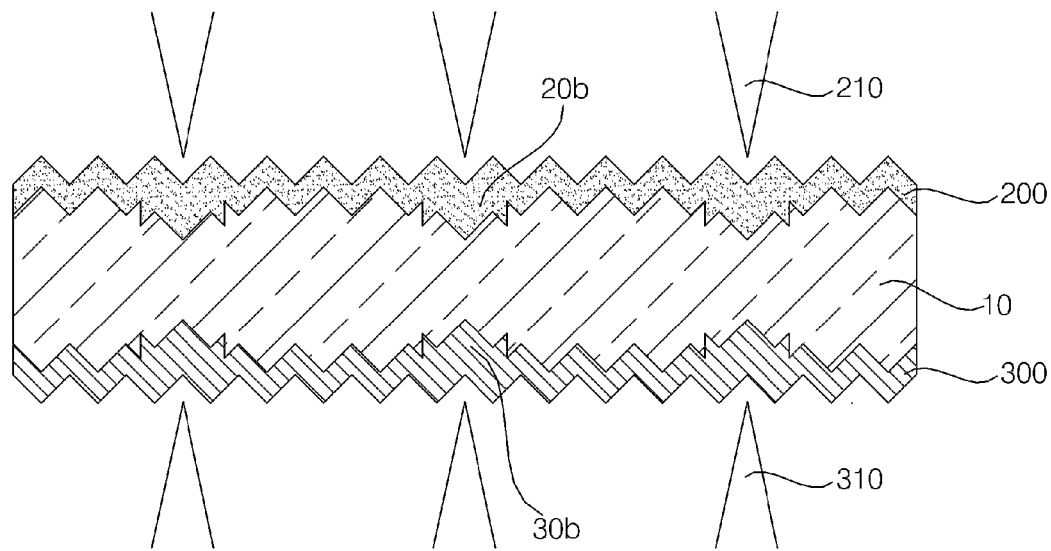
Figure 3D:
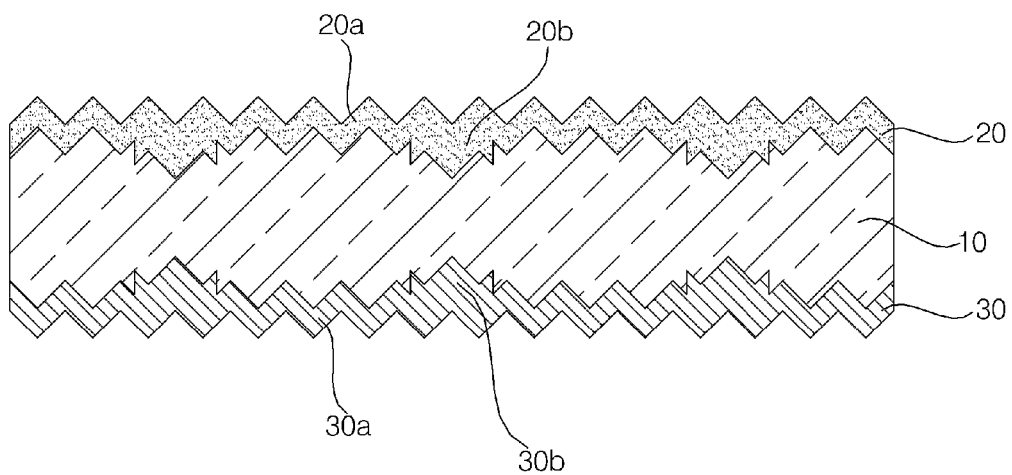

Next, as shown in FIG. 3c, in the step ST30 for firstly activating, the second portions 20b and 30b are selectively activated so that the second portions may have the second resistance lower than the first resistance of the first portions 20a and 20b. Lasers 210 and 310 are selectively irradiated along predetermined patterns of the second portion 20b of the emitter layer 20 and the second portion 30b of the back surface field layer 30, and thus, the dopants inside the second portions 20b and 30b are activated. In the step ST30 for the firstly activating, the heat-treatment is selectively performed only to the second portions 20b and 30b so that the second portions 20b and 30b may have a higher doping concentration and a lower resistance than the first portions 20a and 30a, respectively.

That is, the dopants inside the second portions 20b and 30b are selectively activated by using the lasers 210 and 310 so that the emitter layer 20 and the back surface field layer 30 may have selective structures. That is, when the laser is irradiated, the portions corresponding to the second portion 20b and 30b are locally heated, and a liquid phase expitaxy growth is generated from the silicon in the semiconductor substrate 10 acting as the seed. This will now be described in detail.

Generally, the semiconductor substrate 10 is damaged or broken and has lots of lattice defects after the ion-implanting. Thus, the mobility of the electrons or the holes is reduced, and the ion-implanted dopants may not be activated since the dopants may not be positioned at the lattice site. When the lasers 210 and 310 are irradiated to the second portions 20b and 30b of the semiconductor substrate 10, recrystallization is generated by the liquid state epitaxy, and the ion-implanted dopant moves to the lattice site and is activated. Also, the ion-implanted dopant in the second portions 20b and 30b is diffused by heat of the lasers 210 and 310, and the second portions 20b and 30b become deeper than the first portions 20a and 30a, respectively.

Accordingly, by firstly activating heat-treatment through using the lasers 210 and 310, the dopant layer (for example, the emitter layer 20 or the back surface field layer 30) having the selective structure may be manufactured by a simpler method. Also, the properties of the dopant layer may be enhanced.

That is, in the conventional thermal diffusion method, the dopant layer having the selective structure is formed by differentiating the dopant dose of the first and second portions through using a mask. In this case, it is possible that the mask is not accurately aligned, and there is the limit of reducing the widths of the second portions 20b and 30b due to the limit of manufacturing the mask. For example, when using the conventional thermal diffusion, the second portions 20b and 30b have minimum widths of about 500 μm. Also, the semiconductor substrate 10 is largely damaged at a portion having higher dopant dose, and thus, the semiconductor substrate 10 is heat-treated at the high temperature in order to recover the damage.

On the other hand, according to the embodiment, by using the lasers 210 and 310, the firstly activating heat-treatment may be selectively performed according to a pattern data of a laser apparatus, and the widths of the second portions 20b and 30b may be minimized. For example, the second portions 20b and 30b may have widths of about 150~350 μm. Also, the dopant dose at the first portions 20a and 30a are substantially the same as the dopant dose at the second portions 20b and 30b, and thus, the damage to the semiconductor substrate 10 may be minimized. Also, because only the second portions 20b and 30b are heated by the lasers, the damage of the semiconductor substrate 10 may be prevented. In addition, the temperature of the secondly activating heat-treatment for recovering the semiconductor substrate 10 may be reduced. The secondly activating heat-treatment will be described later in more detail.

Here, after the firstly activating is selectively performed to the second portion 20b of the emitter layer 20, the firstly activating may be selectively performed to the second portion 30b of the back surface field layer 30. Alternatively, after the firstly activating is selectively performed to the second portion 30b of the back surface field layer 30, the firstly activating may be selectively performed to the second portion 20b of the emitter layer 20.

Also, as shown in FIG. 3c, the lasers 210 and 310 may be simultaneously irradiated to the front and back surfaces of the semiconductor substrate 10 in order to simultaneously form the second portion 20b of the emitter layer 20 and the second portion 30b of the back surface field layer 30. In this case, the process may be more simplified.

In the embodiment, in the step ST30 for the firstly activating, various lasers may be used for the lasers 210 and 310. For example, the lasers 210 and 310 may be an Nd-YVO$_4$ lasers. The second portions 20b and 30b may be heated to a temperature suitable for forming the second portions 20b and 30b, for example, about 100~1500° C. The temperature range may be decided so that the second portions 20b and 30b are not damaged and/or have proper resistance.

Next, as shown in FIG. 3d, in step ST40 of the secondly activating, the semiconductor substrate 10 is totally or entirely heat-treated. That is, the first layer 200 (of FIG. 2c) and the second layer 300 (of FIG. 2c) are totally heat-treated, and thus, the first and second portions 20a and 20b of the emitter layer 20 and the first and second portions 30a and 30b of the back surface field layer 30 may be uniformly heat-treated. Accordingly, the damage due to the lasers 210 and 310 (of FIG. 2c) is eliminated, and the ion-implanted dopants of the emitter layer 20 and the back surface field layer 30 may be activated. Then, the unactivated dopants of the first portions 20a and 30a of the emitter layer 20 and the back surface field layer 30 are activated. Also, the dopants of the second portions 20b and 30b the emitter layer 20 and the back surface field layer 30 are activated once more, and thus, the amount of the activated dopants of the second portions 20b and 30b is more than that of the first portions 20a and 30a.

Here, the heat-treatment temperature may be varied according to the kind of the dopant. For example, when the dopant is boron, the heat-treatment temperature may be in a range of about 950~1300° C. When the dopant is phosphorus, the heat-treatment temperature may be in a range of about 80~950° C. When boron and phosphorus are simultaneously activated, the heat-treatment temperature may be in a range of about 950~1300° C. The secondly heating may be performed in a heat-treating furnace. That is, the secondly heating may be performed for about dozens of seconds to about 10 minutes in a rapid thermal annealing (RTA) apparatus, or for about 1 to 4 hours in a furnace. However, the present invention is not limited thereto. The secondly heating may be performed for various times at various heat-treatment temperatures.

As stated in the above, since the amount of the dopant dose of the second portions 20b and 30b is same as that of the first portions 20a and 30a, the damage of the semiconductor substrate 10 may be minimized. Also, the secondly heating may be performed at the low heat-treatment temperature.

In the embodiment, after the second conductive type dopant is ion-implanted with a uniform dose at the first portion 20a (or the first portion 30a) and the second portion 20b (or the second portion 30b), the firstly activating heat-treatment is locally performed to the second portion 20b (or second portion 30b). Then, the amount of the activated dopant of the second portion 20b (or the second portion 30b) may increase, and the resistance of the second portion 20b (or the second portion 30b) may be reduced and the doping depth may increase. Thus, the damage of the semiconductor substrate 10 may be minimized and the heat-treatment may be reduced. Also, the second portion 20b (or the second portion 30b) may be accurately aligned, and the width of the second portion 20b (of the second portion 30b) may be reduced.

Figure 3E:
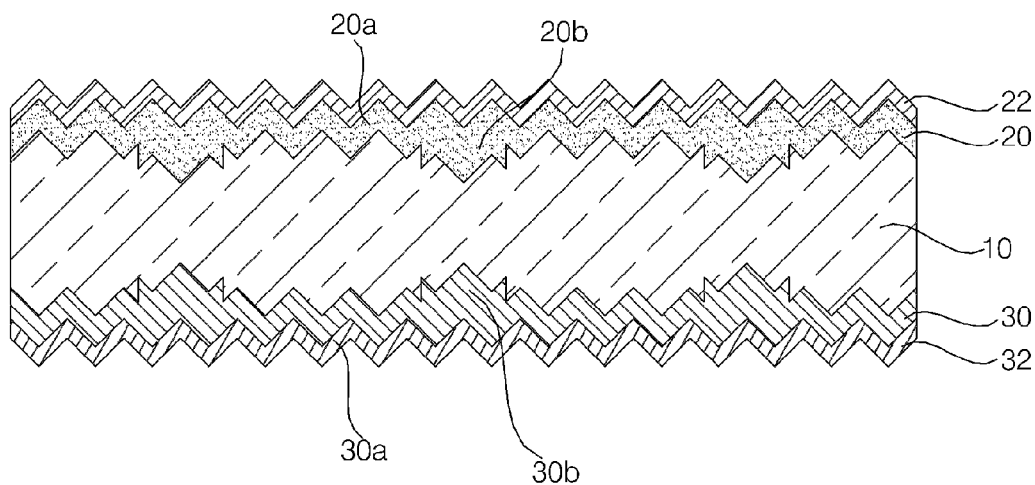

Next, as shown in FIG. 3e, in the step ST50 for forming the anti-reflection film and the passivation film, the anti-reflection film 22 and the passivation film 32 are formed on the front surface and the back surface of the semiconductor substrate 10, respectively. The anti-reflection film 22 and the passivation film 32 may be formed by various methods such as vacuum evaporation, a chemical vapor deposition, a spin coating, a screen printing, or a spray coating. The anti-reflection film 22 and the passivation film 32 may be simultaneously or sequentially formed.

Figure 3F:
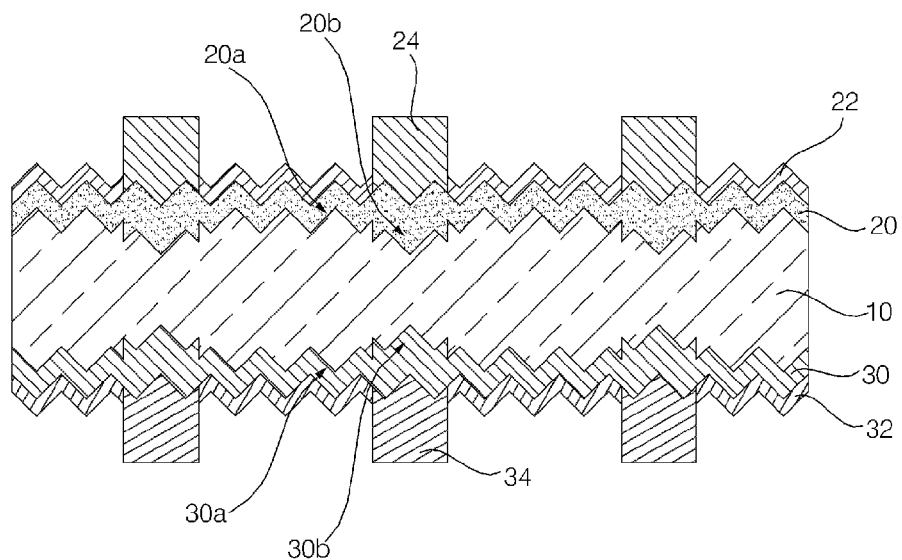

Next, as shown in FIG. 3f, in the step ST60 for forming the electrode, a front electrode 24 is electrically connected to the second portion 20b of the emitter layer 20 and a back electrode 34 is electrically connected to the second portion 30b of the back surface field layer 30. For example, a front electrode layer and a back electrode layer are formed on the front surface and the back surface of the semiconductor substrate 10, respectively, and are fired to form a front electrode 24 and a back electrode 34.

The front and back electrode layers may be formed by coating a paste including metal having a high electric property (for example, silver), glass frit, a binder, and a solvent. The front and back electrode layers are coated on the semiconductor substrate 10 by a printing method. When the front and back electrode layers are fired, and by firing through, the front electrode 24 penetrates the anti-reflection film 22 and comes in contact to the emitter layer 20, and the back electrode 34 penetrates the passivation film 32 and comes in contact to the back surface field layer 30. Accordingly, the solar cell 100 as shown FIG. 1 is manufactured.

However, the present invention is not limited thereto. The front and back electrodes 24 and 34 may be formed by plating a metal inside openings, after forming the openings at the anti-reflection film 22 and the passivation film 32. That is, the front and back electrodes 24 may be formed by various methods.

In the above, the emitter layer 20 and the back surface field layer 30 includes the first portions 20a and 30a and the second portions 20b and 30b, respectively. However, the present invention is not limited thereto.

Figure 4:
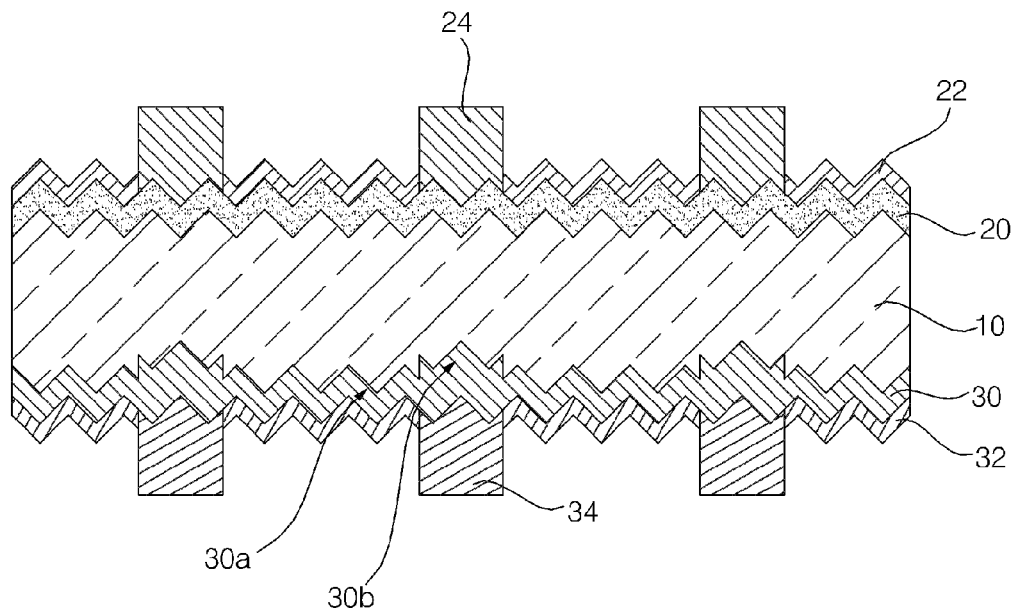
FIG. 4 is a cross-sectional view illustrating a solar cell manufactured by a method for manufacturing a solar cell according to a modified embodiment of the present invention.
Figure 5:
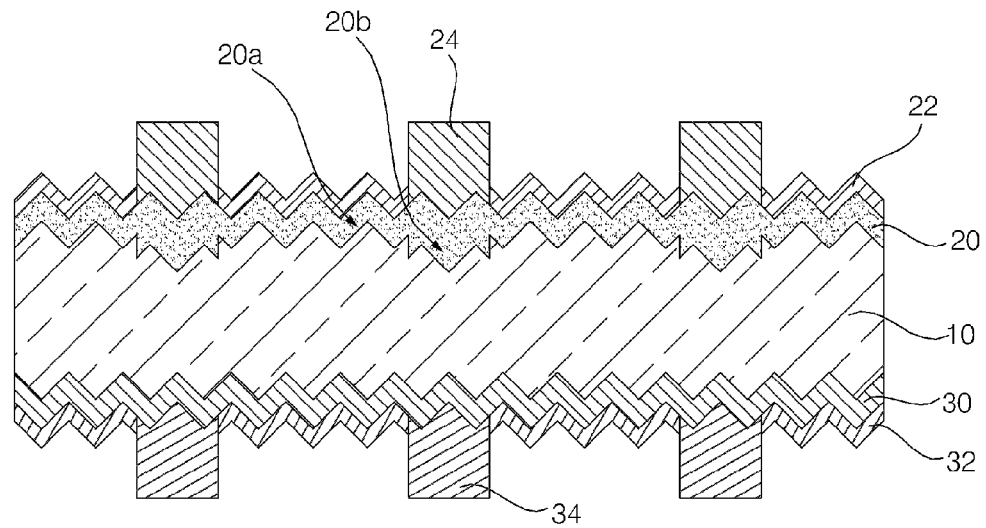
FIG. 5 is a cross-sectional view illustrating a solar cell manufactured by a method for manufacturing a solar cell according to another modified embodiment of the present invention.

That is, as shown in FIG. 4, only the back surface field layer 30 may include the first portion 30a and the second portion 30b, and the emitter layer 20 may have a uniform resistance without a second portion. In this case, in the firstly activating heat-treatment, only the second portion 30b of the back surface field layer 30 is heat-treated. Alternatively, as shown in FIG. 5, only the emitter layer 20 may include the first portion 20a and the second portion 20b, and the back surface field layer 30 may have a uniform resistance without a second portion. In this case, in the firstly activating heat-treatment, only the second portion 20b of the emitter layer 20 is heat-treated.

Also, the step of forming the emitter layer 20 and the step of forming the back surface field layer 30 may be sequentially performed. That is, the first layer 200 for forming the emitter layer 20 may be formed, and then, the firstly activating heat-treatment may be performed to the second portion 20a of the emitter layer 20. After that, the second layer 300 for forming the back surface field layer 30 may be formed, and then, the firstly activating heat-treatment is performed to the second portion 30a of the back surface field layer 30. Alternatively, the second layer 300 for forming the back surface field layer 30 may be formed, and then, the firstly activating heat-treatment is performed to the second portion 30a of the back surface field layer 30. After that, the first layer 200 for forming the emitter layer 20 may be formed, and then, the firstly activating heat-treatment may be performed to the second portion 20a of the emitter layer 20. In these cases, when the emitter layer 20 or the back surface field layer 30 does not have the second portion 20a or 30a, the corresponding firstly activating heat-treatment is omitted.

These modifications may be applied to various embodiments.

Hereinafter, a method for manufacturing a solar cell according to another embodiment of the present invention will be described with reference to FIGS. 6a to 6f. FIGS. 6a to 6f are cross-sectional views for illustrating a method for manufacturing a solar cell according to another embodiment of the present invention. In the following description, the portions that are the same as or similar to those in the embodiment shown in FIGS. 3a to 3f may be omitted, and the portions that are different from those in the embodiment shown in FIGS. 3a to 3f may be described in more detail.

Figure 6A:
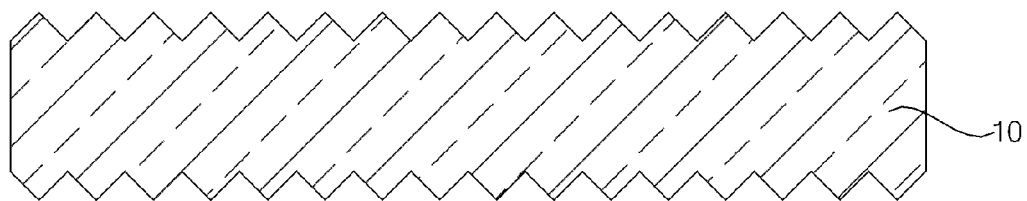
FIGS. 6a to 6f are cross-sectional views for illustrating a method for manufacturing a solar cell according to another embodiment of the present invention.
Figure 6B:
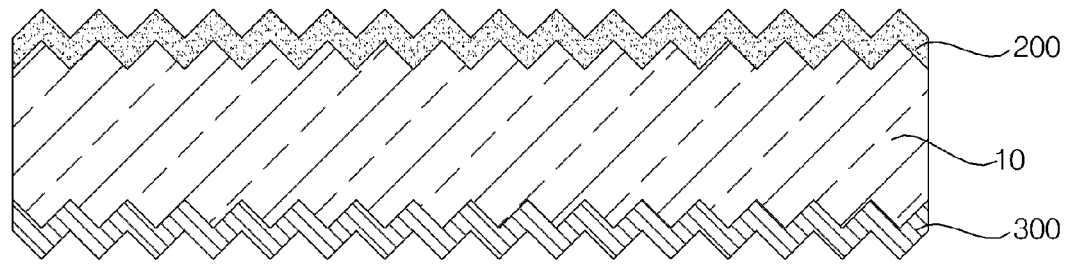

First, as shown in FIG. 6a, a semiconductor substrate 10 having a first conductive type dopant is prepared.

Next, as shown in FIG. 3b, a first layer 200 is formed by doping the second conductive type dopant at the front surface of the semiconductor substrate 10, and a second layer 300 is formed by doping the first conductive type dopant at the back surface of the semiconductor substrate 10.

Figure 6C:
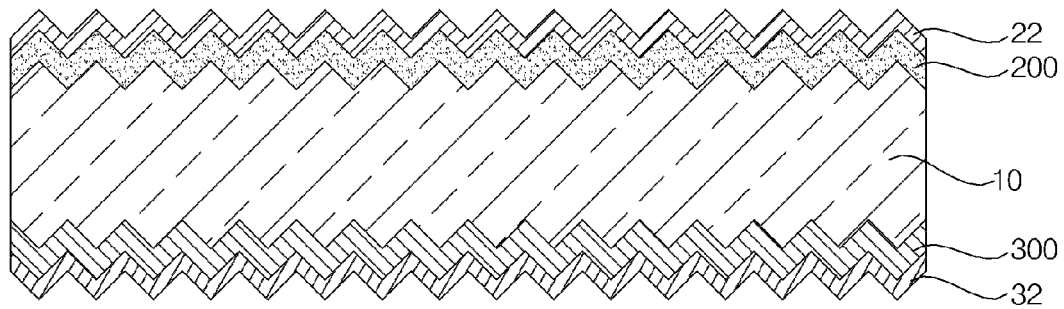

Next, as shown in FIG. 6c, an anti-reflection film 22 and a passivation film 32 are formed on the front and back surfaces of the semiconductor substrate 10, respectively.

Figure 6D:
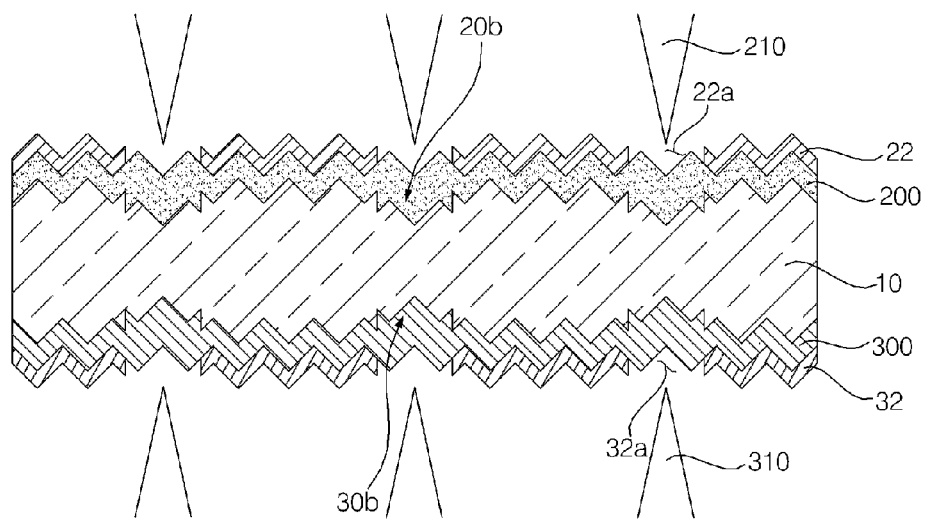
Figure 6E:
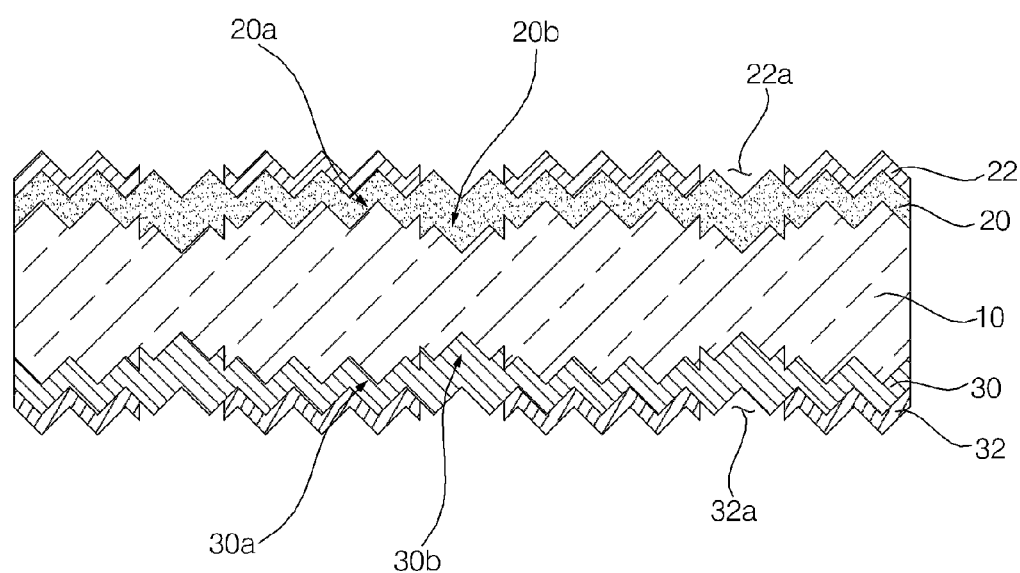

Next, as shown in FIG. 6d, dopants of second portions 20b and 30b (of FIG. 6e) of the emitter layer 20 (of FIG. 6e) and the back surface field layer 30 (of FIG. 6e) are activated by selectively irradiating lasers 210 and 310 according to patterns of the second portions 20b and 30b (refer to FIG. 6e). That is, the dopant of the second portions 20b and 30b are selectively activated so that the emitter layer 20 and the back surface field layer 30 may have selective structure. Here, the dopant in the second portions 20b and 30b is diffused by heat of the lasers 210 and 310, and the second portions 20b and 30b become deeper than the first portions 20a and 30a (of FIG. 6e), respectively.

In the embodiment, the lasers 210 and 310 for forming the second portions 20b and 30b are irradiated through the anti-reflection film 22 and the passivation film 32 on the second portions 20b, 30b. In this step, openings 22a and 32a may be formed at the anti-reflection film 22 and the passivation film 32. Since the openings 22a and 32a are accurately positioned on the second portions 20b and 30b, front and back electrodes 24 and 34 (of FIG. 6f) formed through the openings 22a and 32a may be accurately aligned with the second portions 20b and 30b.

In the conventional laser doping selective emitter (LDSE) method, after forming an anti-reflection film, an additional dopant layer is formed on the anti-reflection film, and then, laser is irradiated. Then, the dopants of the additional dopant layer are diffused into the semiconductor substrate 10. In this case, when the solubility of the second conductive type dopant in the semiconductor substrate 10 including silicon (for example, the second conductive type dopant is boron), the laser has a high energy density. Thus, during laser doping, the semiconductor substrate 10 may be melted, and thus, lots defects may be generated at the semiconductor substrate 10. Also, since the dopants are doped through the anti-reflection film 22, the control of the doping at the semiconductor substrate 10 may be difficult. In addition, after the doping, the process for removing the additional dopant layer should be added.

On the other hand, in the embodiment, after forming the first layer 200 and the second layer 300 on the semiconductor substrate 10, the anti-reflection film 22 and the passivation film 32 are formed. After that, the firstly activating heat-treatment is performed by the lasers 210 and 310. Thus, the process for removing the additional dopant layer may not be necessary. Also, since the activation and the recovery is generated by following secondly activating heat-treatment, the energy density of the lasers 210 and 310 at the firstly activating heat-treatment may be reduced, and the defects of the semiconductor substrate 10 may be reduced.

Next, as shown in FIG. 6e, the semiconductor substrate 10 is totally or entirely heat-treated in the secondly activating heat-treatment.

Figure 6F:
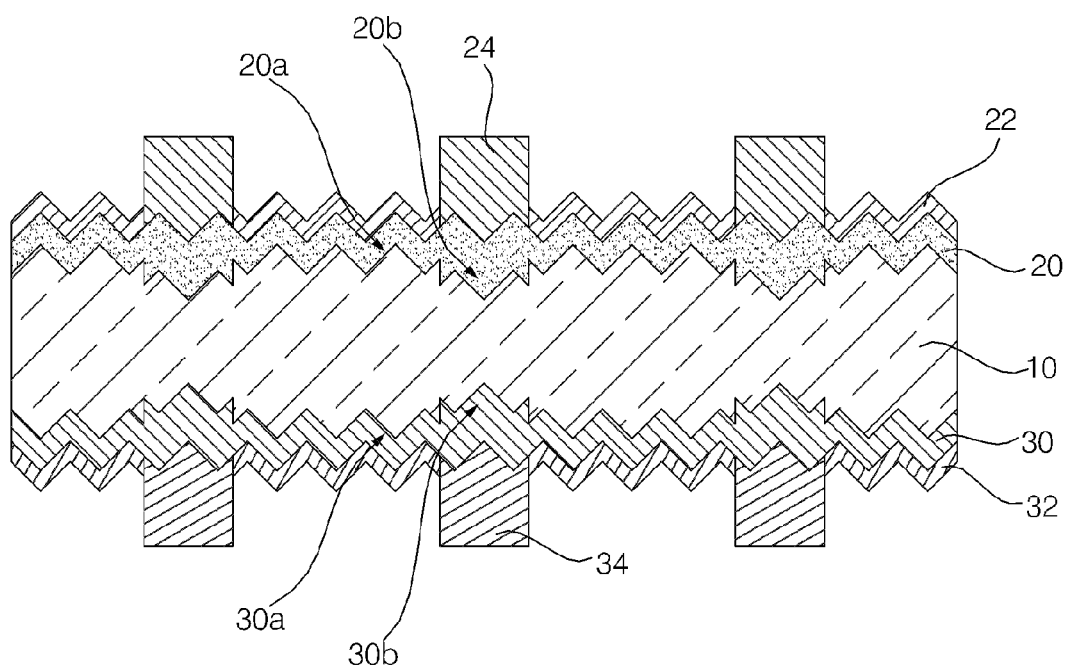

Next, as shown in FIG. 6f, a front electrode 24 electrically connected to the second portion 20b of the emitter layer 20 is formed in the opening 22a of the anti-reflection film 22, and a back electrode 34 electrically connected to the second portion 30b of the back surface field layer 30 is formed in the opening 32a of the passivation film 32.

In the embodiment, after ion-implanting dopants uniformly, only the second portion is selectively activated by the firstly activating, and thus, the dopant layer (the emitter layer or the back surface field layer) may have a selective structure. Also, an entire activation is induced by the secondly activating, and thus, the first portion which is not heat-treated in the firstly activating is activated in the secondly activating.

Here, by the firstly activating through using the laser, the dopant layer having the selective structure may be formed without an additional mask or an additional ion-implanting process. That is, the process may be simplified. In addition, the dopant dose at the first portions are substantially the same as the dopant dose at the second portions, and thus, the damage of the semiconductor substrate may be minimized. Further, the temperature of the secondly activating heat-treatment for recovering the semiconductor substrate may be reduced. Also, the width of the second portion may be minimized by forming the second portion through using the laser.

Selectively, when the firstly activating is performed after forming the anti-reflection film and/or the passivation film, the opening is formed in the firstly activating at the anti-reflection film and/or the passivation film corresponding to the second portion. Thus, an align property between the electrode formed inside the opening and the second portion may be accurate. Thus, the properties of the solar cell may be enhanced.

Certain embodiments of the invention have been described. However, the invention is not limited to the specific embodiments described above; and various modifications of the embodiments are possible by those skilled in the art to which the invention belongs without leaving the scope defined by the appended claims. Also, modifications of the embodiments should not be understood individually from the technical principles or prospects of the invention.

What is claimed is:

1. A method for manufacturing a solar cell, wherein the solar cell comprises a dopant layer having a first portion of a first resistance and a second portion of a second resistance lower than the first resistance, the method comprising:
    ion-implanting a dopant into a semiconductor substrate to form the dopant layer;
    first, activating by heating the second portion to activate dopant inside the dopant layer at the second portion without supplying additional dopant; and
    second, activating by heating the first portion and the second portion to activate the dopant at the first portion and the second portion, after the first activating,
    wherein the dopant layer comprises an emitter layer at a front surface of the semiconductor substrate and a back surface field layer at a back surface of the semiconductor substrate,
    wherein the dopant comprises a first dopant of a first conductivity type and a second dopant of a second conductivity type,
    wherein the emitter layer is doped with the first dopant and the back surface field layer is doped with the second dopant,
    wherein each of the emitter layer and the back surface field layer comprises the first portion and the second portion,
    wherein, during the first activating, the second portion of the emitter layer and the second portion of the back surface field layer are heated, and
    wherein during the second activating, the first portion and the second portion of the emitter layer and the first portion and the second portion of the back surface field layer are heated.

2. The method according to claim 1, wherein the ion-implanting comprises:
    implanting a dose of the dopant into the first portion of one of the emitter layer and the back surface field layer and a dose of the dopant into the second portion of the one of the emitter layer and the back surface field layer; and
    in the first activating, activating the dopant at the second portion of the one of the emitter layer and the back surface field layer so that the second portion of the one of the emitter layer and the back surface field layer has the second resistance lower than the first resistance of the first portion of the one of the emitter layer and the back surface field layer.

3. The method according to claim 1, wherein the first activating comprises irradiating the second portion with a laser.

4. The method according to claim 1, wherein the dopant of the dopant layer comprises boron (B), and in the ion-implanting, implanting boron with a dose about $2\sim4\times10^{15}/cm^2$ by using an energy of about 5~20keV.

5. The method according to claim 1, wherein the dopant of the dopant layer comprises phosphorus (P), and
    in the ion-implanting, implanting phosphorus with a dose about $3\sim8\times10^{15}/cm^2$ by using an energy of about 10~50keV.

6. The method according to claim 1, wherein the first activating comprises heating the second portion to a temperature of about 1000~1500° C.

7. The method according to claim 2, wherein, in the first activating, a laser used in the step comprises a Nd-YVO$_4$ laser.

8. The method according to claim 1, further comprising forming a passivation film for covering one surface of the semiconductor substrate where the dopant is implanted, between the ion-implanting and the first activating.

9. The method according to claim 8, wherein the first activating comprises irradiating by a laser one surface of the semiconductor substrate where the passivation film is formed.

10. The method according to claim 9, wherein the first activating comprises forming an opening by the laser at a portion of the passivation film corresponding to the second portion.

11. The method according to claim 10, further comprising forming an electrode electrically connected to the second portion through the opening, after the second activating.

12. The method according to claim 1, wherein the dopant layer comprises at least one of an emitter layer and a back surface field layer.

13. The method according to claim 1, wherein the dopant of the dopant layer comprises boron, and
    during the second activating, heating the first portion and the second portion to a temperature of about 950~1300° C.

14. The method according to claim 1, wherein the dopant of the dopant layer comprises phosphorus, and
    during the second activating, heating the first portion and the second portion to a temperature of about 800~950° C.

15. The method according to claim 1, wherein the second activating is performed in a heat-treating furnace.

16. The method according to claim 1,
    wherein each of the emitter layer and the back surface field layer comprises the first portion and the second portion,
    wherein, the first activating comprises irradiating by lasers to the front and the back surfaces of the semiconductor substrate to heat the second portion of the emitter layer and the second portion of the back surface field layer, and wherein, during the second activating, heating the semiconductor substrate to simultaneously heat the first portion and the second portion of the emitter layer and the back surface field layer.

17. The method according to claim 16, wherein the first activating comprises irradiating by lasers to the front and the back surfaces of the semiconductor substrate to simultaneously heat the second portion of the emitter layer and the second portion of the back surface field layer.

18. The method according to claim 16, wherein the first activating comprises heating the second portion of the emitter layer and the second portion of the back surface field layer to a temperature of about 1000~1500° C.

19. The method according to claim 16, wherein the second activating comprises heating the first portion and the second portion to a temperature of about 950~1300° C.

20. The method according to claim 16, wherein if one of the emitter layer and the back surface field layer is doped with boron, the remaining of the emitter layer and the back surface field layer is doped with phosphorus, and wherein the ion-implanting comprises implanting boron with a dose about $2\sim4\times10^{15}/cm^2$ by using an energy of about 5~20keV, and implanting phosphorus with a dose about $3\sim8\times10^{15}/cm^2$ by using an energy of about 10~50keV.

\* \* \* \* \*